(12) United States Patent
Rue

(10) Patent No.: US 8,455,822 B2
(45) Date of Patent: Jun. 4, 2013

(54) NAVIGATION AND SAMPLE PROCESSING USING AN ION SOURCE CONTAINING BOTH LOW-MASS AND HIGH-MASS SPECIES

(75) Inventor: Chad Rue, Portland, OR (US)

(73) Assignee: FEI Company, Hillsboro, OR (US)

( * ) Notice: Subject to any disclaimer, the term of this patent is extended or adjusted under 35 U.S.C. 154(b) by 35 days.

(21) Appl. No.: 13/223,276

(22) Filed: Aug. 31, 2011

(65) Prior Publication Data

US 2012/0056088 A1  Mar. 8, 2012

Related U.S. Application Data

(60) Provisional application No. 61/378,643, filed on Aug. 31, 2010.

(51) Int. Cl.
*H01J 37/317* (2006.01)
(52) U.S. Cl.
CPC .................. *H01J 37/317* (2013.01)
USPC .................... 250/309; 250/492.21
(58) Field of Classification Search
USPC .......................... 250/309, 492.21
See application file for complete search history.

(56) References Cited

U.S. PATENT DOCUMENTS

| | | |
|---|---|---|
| 3,326,176 A | 6/1967 | Sibley |
| 4,367,429 A | 1/1983 | Wang et al. |
| 4,393,311 A | 7/1983 | Feldman et al. |
| 4,451,738 A | 5/1984 | Smith |
| 4,683,378 A | 7/1987 | Shimase et al. |
| 4,859,908 A | 8/1989 | Yoshida et al. |
| 4,870,284 A | 9/1989 | Hashimoto et al. |
| 4,874,459 A | 10/1989 | Coldren et al. |
| 5,035,787 A | 7/1991 | Parker et al. |
| 5,036,252 A | 7/1991 | Lob |
| 5,054,097 A | 10/1991 | Flinois et al. |
| 5,055,696 A | 10/1991 | Haraichi et al. |
| 5,086,230 A | 2/1992 | Adachi et al. |
| 5,108,535 A | 4/1992 | Ono et al. |
| 5,149,974 A | 9/1992 | Kirch et al. |

(Continued)

FOREIGN PATENT DOCUMENTS

| | | |
|---|---|---|
| JP | 03-272549 | 12/1991 |
| JP | 04-343040 | 11/1992 |

(Continued)

OTHER PUBLICATIONS

Bischoff, L., "Alloy Liquid Metal Ion Sources and their Application in Mass Separated Focused Ion Beams," Ultramicroscopy, 2005, pp. 59-66, vol. 103.

(Continued)

*Primary Examiner* — Kiet T Nguyen
(74) *Attorney, Agent, or Firm* — Scheinberg & Associates, PC

(57) ABSTRACT

An improved method and apparatus for imaging and milling a substrate using a FIB system. Preferred embodiments of the present invention use a mixture of light and heavy ions, focused to the same focal point by the same beam optics, to simultaneously mill the sample surface (primarily with the heavy ions) while the light ions penetrate deeper into the sample to allow the generation of images of subsurface features. Among other uses, preferred embodiments of the present invention provide improved methods of navigation and sample processing that can be used for various circuit edit applications, such as backside circuit edit.

21 Claims, 11 Drawing Sheets

U.S. PATENT DOCUMENTS

| | | | |
|---|---|---|---|
| 5,159,643 A | 10/1992 | Kaga et al. | |
| 5,188,705 A | 2/1993 | Swanson et al. | |
| 5,206,516 A * | 4/1993 | Keller et al. | 250/492.2 |
| 5,278,408 A | 1/1994 | Kakibayashi et al. | |
| 5,376,791 A | 12/1994 | Swanson et al. | |
| 5,401,972 A | 3/1995 | Talbot et al. | |
| 5,591,970 A | 1/1997 | Komano et al. | |
| 5,683,547 A | 11/1997 | Azuma et al. | |
| 5,686,796 A | 11/1997 | Boswell et al. | |
| 5,700,526 A | 12/1997 | Ximen et al. | |
| 5,798,529 A | 8/1998 | Wagner | |
| 5,945,677 A | 8/1999 | Leung et al. | |
| 6,127,275 A | 10/2000 | Flamm | |
| 6,239,404 B1 | 5/2001 | Lea et al. | |
| 6,639,226 B2 | 10/2003 | Morio et al. | |
| 6,770,836 B2 | 8/2004 | Kwon et al. | |
| 6,833,051 B2 | 12/2004 | Kazumi et al. | |
| 6,838,380 B2 | 1/2005 | Bassom et al. | |
| 6,897,157 B2 | 5/2005 | Liang et al. | |
| 6,975,072 B2 | 12/2005 | Leung et al. | |
| 7,002,513 B2 | 2/2006 | Brabec et al. | |
| 7,084,407 B2 | 8/2006 | Ji et al. | |
| 7,176,469 B2 | 2/2007 | Leung et al. | |
| 7,221,314 B2 | 5/2007 | Brabec et al. | |
| 7,241,361 B2 | 7/2007 | Keller et al. | |
| 7,287,840 B2 | 10/2007 | Miyazawa et al. | |
| 7,291,959 B2 | 11/2007 | Miyazawa et al. | |
| 7,351,966 B1 | 4/2008 | Marchman et al. | |
| 7,388,218 B2 | 6/2008 | Carleson | |
| 7,442,916 B2 | 10/2008 | Lee et al. | |
| 7,494,937 B2 | 2/2009 | Clark | |
| 7,531,452 B2 | 5/2009 | Clark | |
| 7,670,455 B2 | 3/2010 | Keller et al. | |
| 7,732,759 B2 | 6/2010 | Chen et al. | |
| 7,776,156 B2 | 8/2010 | Long et al. | |
| 7,829,870 B2 | 11/2010 | Frosien | |
| 8,003,958 B2 * | 8/2011 | Yamazaki et al. | 250/492.21 |
| 8,059,918 B2 | 11/2011 | Young et al. | |
| 8,076,650 B2 | 12/2011 | Smith et al. | |
| 8,168,957 B2 | 5/2012 | Keller et al. | |
| 2005/0098118 A1 | 5/2005 | Amann et al. | |
| 2006/0249479 A1 | 11/2006 | Okubo et al. | |
| 2009/0200484 A1 | 8/2009 | Frosien | |

FOREIGN PATENT DOCUMENTS

| | | |
|---|---|---|
| JP | 6176725 | 6/1994 |
| JP | 7312201 | 11/1995 |
| JP | 7335163 | 12/1995 |

OTHER PUBLICATIONS

"Electron Microbeam Analysis Laboratory: Image Contrast," University of Michigan, 2004, 1 page.

Reiche, Rainer, et al., "Applications of Helium Ion Microscopy in Semiconductor Manufacturing," Microscopy and Analysis, 2009, pp. 11-14, vol. 23, No. 5.

"Electron Microbeam Analysis Laboratory: The Scanning Electron Microscope," University of Michigan, 2004, 1 page.

Alanko, T., et al., 'Simultaneous Wide-Range Stopping Power Determination for Several Ions,' Nuclear Instruments and Methods in Physics Research B, 2002, pp. 60-63, vol. 190.

Coupland, J.R., et al., 'A Study of the Ion Beam Intensity and Divergence Obtained from a Single Aperture Three Electrode Extraction System,' American Institute of Physics, Sep. 1973, vol. 44,, No. 9, pp. 1258-1270.

Hopwood, J., "A Microfabricated Inductively-Coupled Plasma Generator," Journal of Microelectronmechanical Systems, 2000, pp. 309-313, vol. 9, Iss. 3.

Jiang, X., et al, 'Mini Rf-Driven Ion Sources for Focused Ion Beam Systems,' Review of Scientific Instruments, Apr. 2003, pp. 2288-2292, vol. 74, No. 4.

Johnson, Wayne, 'Electrostatically-Shielded Inductively-Coupled RF Plasma Sources,' High Density Plasma Sources, Ed. Oleg A. Popov, 1995, pp. 100-148.

Koivisto, H. et al., 'Electron Cyclotron Resonance Ion Source Related Development work for Heavy-Ion Irradiation Tests,' Review of Scientific Instruments, 2006, 3 pgs, vol. 77.

Leung, Ka-Ngo, "Plasma Sources for Electrons and Ion Beams," J. Vac. Sci. Technol. B, Nov./Dec. 1999, pp. 2776-2778, vol. 17, Iss. 6.

Lieberman, M.A., et al., Principles of Plasma Discharges and Materials Processing, 1994, pp. 31-37, pp. 157-163, 1st Edition, John Wiley & Sons, New York.

Virtanen, A., et al., 'Heavy Ion and Proton Test Site at JYFL-Accelerator Laboratory,' Nuclear Instruments and Methods in Physics Research A, 1999, pp. 68-71, vol. 426.

Yin, Y., et al., "Miniaturization of Inductively Coupled Plasma Sources," IEEE Trans. Plasma Science, 1992, pp. 109-116, vol. 27, No. 5.

* cited by examiner

NAVIGATION AND SAMPLE PROCESSING USING AN ION SOURCE CONTAINING BOTH LOW-MASS AND HIGH-MASS SPECIES

CROSS-REFERENCE TO RELATED APPLICATIONS

This application claims priority from U.S. Prov. Pat. App. No. 61/378,643, filed Aug. 31, 2010, which is hereby incorporated by reference.

TECHNICAL FIELD OF THE INVENTION

The present invention relates to stage navigation and beam placement in particle beam systems and, in particular, to high accuracy local area navigation to a site of interest on a sample surface and mill end-pointing using a focused ion beam.

BACKGROUND OF THE INVENTION

Modern integrated circuits (ICs) are composed of multiple layers of conductors and substrate materials, such as insulators and semiconductors. Inspecting and editing a circuit or other hidden interior feature in an IC requires navigating to the target area and milling through one or more of the multiple layers of substrate material. Circuit Edit (CE) reduces IC development costs by reducing the number of mask sets that are required during the design-debug phase, and speeds overall time-to-market.

Most CE activities today are performed with Focused Ion Beam (FIB) systems, which are commonly used to mill away a substrate material to expose hidden features and also deposit materials with high precision. These capabilities can be used to cut and connect circuitry within a device, as well as to create probe points for electrical test. Applications include validating design changes, debugging and optimizing devices in production, and prototyping new devices without costly and time-consuming mask set fabrication.

Typically material removal in FIB systems is accomplished by using beams of relatively large ions to physically sputter away the substrate material. Most FIB systems use gallium ions produced by a Liquid Metal Ion Source (LMIS) because such sources are easy to fabricate, operate at room temperature, and are reliable, long lived, and stable. Ion sources using indium are also known.

In LMIS systems, it is also known to use alloy sources comprising metal alloys of two or more different elements. Prior art alloy sources are typically equipped with mass filters so that the desired ion species can be selected. Alloy sources are often used because the desired ion species alone would be unsuitable for use in a LMIS (for example when the elemental species has a too high melting point) but the properties of the alloy are more favorable. Alloy sources have also been used to switch between two desired ion species for implantation, such as using an alloy source producing beryllium and silicon ions to implant p-layer and n-layer structures, respectively, on a gallium arsenide substrate.

Plasma ion sources have also been used to form ion beams. The magnetically enhanced, inductively coupled plasma ion source described in U.S. Pat. App. Pub. No. 2005/0183667 for a "Magnetically enhanced, inductively coupled plasma source for a focused ion beam system" can be used to produce a finely focused beam with a relatively large beam current that can be used for CE applications.

Although FIB systems can also be used to generate a sample image while milling in order to monitor the milling process, the image is typically restricted to the very top surface of the sample. This causes problems for CE applications because many modern ICs do not include visible surface features to serve as reference points for navigation. This is especially true for backside editing, which is becoming increasingly common for CE. Instead of trying to mill through many layers of dense circuitry from the front, operators turn the device over and mill through the substrate silicon to access target areas from the back.

FIG. 1 shows a schematic representation of a typical prior art backside IC device 10. As shown in FIG. 1, a solid layer of silicon 12 typically covers the backside of the circuitry. Underneath the silicon layer, the IC device shown in FIG. 1 includes an active region 14 and a number of deeper metal layers M1 through M5, with each layer including metal lines 16 and vias 18 surrounded by a dielectric material 20. FIG. 2 shows a schematic representation of the backside IC device of FIG. 1 after a wedge polish, which is an angled polish that exposes multiple layers at once. In the schematic view of FIG. 2, it can be seen that the wedge polish has removed all of the silicon and active layers and exposed portions of metal layers M2 and M3. In a top-down view of a sample such as the one shown in FIG. 2, as the sample is viewed from left to right, in area 22 a via and portions of the dielectric from layer M2 would be visible; in area 24 a portion of the M2 metal line would be visible; in area 26 portions of vias surrounded by dielectric would be visible; and finally in area 28 the metal line of layer M3 would be visible.

A wedge polish as shown in FIG. 2, while a convenient way of looking at multiple layers at once, cannot be used for actual CE because the IC device is destroyed. For CE of features hidden beneath a sample surface, such as found in backside edits on bulk silicon samples, it is typically necessary to precisely determine the location of a desired buried feature and then to mill away substrate material in order to expose that feature. Unfortunately, it can be very difficult to locate such hidden features precisely. Even when the beam is positioned correctly, it is often difficult to expose the features without damaging the features with the ion beam. Once the features are visible in the FIB image, some degree of damage has already taken place. In other words, when using FIB imaging to determine when a feature is exposed and milling should be stopped, often referred to as end-pointing, the feature can be damaged or even destroyed before the milling can be stopped. Moreover, in order to find reference points in an image to determine where on the circuit the feature of interest is located, it is sometimes necessary to expose by trial and error a relatively large area, potentially damaging each area that is exposed.

In one method for navigation on a bulk silicon device, after a sample substrate has been sufficiently thinned by ion milling, it is sometimes possible to visually differentiate highly doped wells from the rest of the substrate in a FIB image. The outline of these doped regions can be useful for navigational purposes. But during backside milling on bulk silicon devices, it is easy to miss the signal from the emerging doped-wells, which can lead to over-milling and damage to the sample. The buried oxide surface itself is very thin and fragile, and the signal from the buried features is also weak and fleeting. Therefore an aggressive high beam current and/or a long dwell time is required to distinguish the transistor wells, which can even further damage the sample.

Real-time imaging using a separate electron beam is another method for determining end-pointing. U.S. Pat. No. 7,388,218 to Carleson for a "Subsurface Imaging Using an Electron Beam," which is assigned to FEI Company of Hillsboro, Oreg., the assignee of the present application, and which is incorporated herein by reference, teaches an electron microscope that can image subsurface features. The electron beam imaging concurrently with the ion beam allows real time viewing of the milling process for end-pointing, and the ability to view subsurface images gives a much greater margin of error when exposing delicate buried features. Unfortunately, the dual-beam system of Carleson suffers from a number of inherent shortcomings. A dual-beam system is necessarily more complex and expensive than a single beam system. Additionally, it is quite difficult to keep both beams focused to the same focal point, which also introduces error into the system. Although systems using coincident and even coaxial ion and electron beams are known, such systems are complex and still include a degree of inaccuracy that it undesirable for many modern CE applications.

The use of helium ions for subsurface imaging is described by Reiche et al. in "Applications of Helium Ion Microscopy in Semiconductor Manufacturing," MICROSCOPY AND ANALYSIS, pp. 11-14 (July 2009). However, helium ions are not suitable for milling applications because of the small size of the ions (and the corresponding lack of physical sample damage that they cause). The helium ion beam of Reiche would have to be combined with a separate ion beam column using larger ions for any significant material removal, and thus would suffer from the same disadvantages as discussed above with respect to Carleson.

Thus, there is still a need for an improved method for imaging and processing samples using FIB systems that allows both for rapid, high accuracy navigation and end-pointing and for rapid material removal once a feature has been located.

SUMMARY OF THE INVENTION

It is an object of the invention, therefore, to provide an improved method and apparatus for imaging and milling a substrate using a FIB system. Preferred embodiments of the present invention use a mixture of light and heavy ions, focused to the same focal point by the same beam optics, to simultaneously mill the sample surface (primarily with the heavy ions) while the light ions penetrate deeper into the sample to allow the generation of images of subsurface features. Among other uses, preferred embodiments of the present invention provide improved methods of navigation and sample processing that can be used for various circuit edit applications, such as backside circuit edit.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Preferred embodiments of the present invention are directed at methods of generating and using an ion beam composed of a mixture of light and heavy ions to provide imaging of subsurface features while still allowing for rapid material removal. In preferred embodiments of the present invention, the light and heavy ions are formed into a mixed beam so that they can be used simultaneously to process a sample, with the heavy ions milling the sample as in a conventional FIB system while the light ions penetrate deeper into the sample to provide information about subsurface features. In other preferred embodiments, a mass filter can be used to rapidly switch between light and heavy ions at a selected frequency to provide imaging of subsurface features while milling, and to also allow adjustment of the ratio of light and heavy ions produced by an alloy LMIS. A plasma FIB with multiple gas sources can also be used to practice the present invention, allowing the ratio of light and heavy ions to be controlled by adjusting the composition of the gas used in the plasma ion source.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

FIB systems commonly used for circuit edit (CE) in semiconductor manufacturing use ion beams formed from relatively large ions, such as gallium, to mill away a substrate material to expose hidden features. Sample imaging using such typical ion beam systems is limited to the very top surface of the sample. As a result, various techniques have been developed to navigate to and safely uncover buried features for CE applications. Unfortunately, these techniques are often time-consuming and require expensive specialized equipment.

Preferred embodiments of the present invention overcome these shortcomings of the prior art by simultaneously using a mixture of light and heavy ions, focused to the same focal point by the same beam optics, to simultaneously mill the sample surface (primarily with the heavy ions) while the light ions penetrate deeper into the sample to allow the generation of images of subsurface features. Among other uses, preferred embodiments of the present invention provide improved methods of navigation and sample processing that can be used for various circuit edit applications, such as backside circuit edit.

Figure 1:
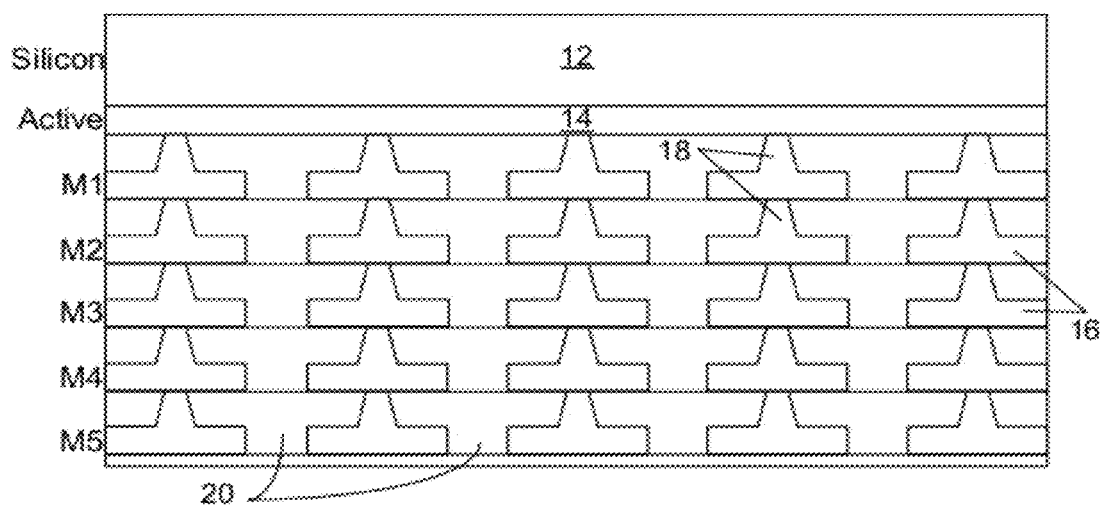
FIG. 1 shows a schematic representation of a prior art backside IC device.
Figure 2:
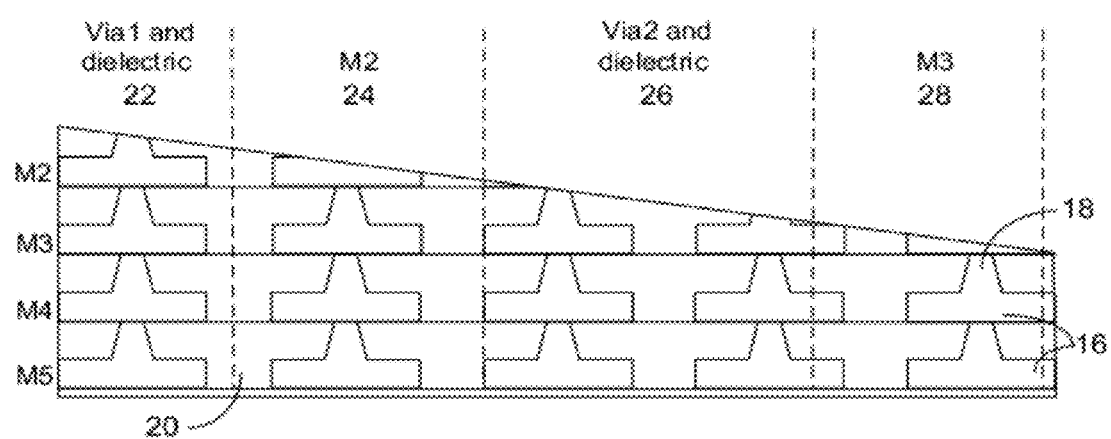
FIG. 2 shows a schematic representation of the backside IC device of FIG. 1 after a wedge polish.
Figure 3:
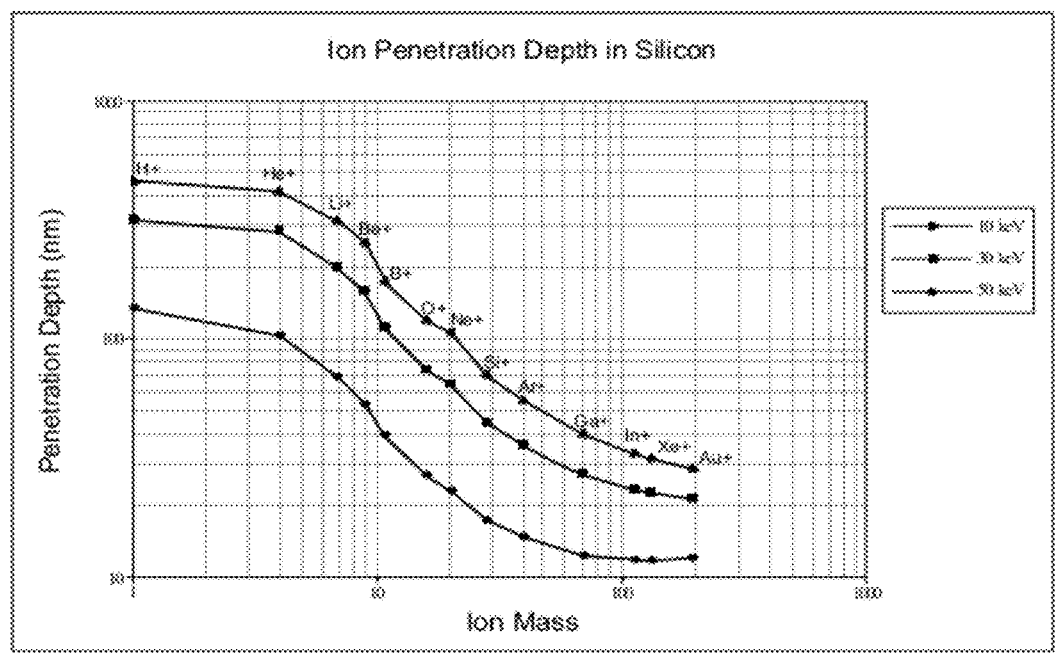
FIG. 3 is a graph showing Monte Carlo (SRIM) calculations of the mean penetration depths of various ions in silicon.

The penetration depth of ions in solids is dependant on the mass of the ion, as illustrated by the graph in FIG. 3 showing Monte Carlo (SRIM) calculations of the mean penetration depths of various ions in silicon. While lighter ions such as helium or beryllium are known to penetrate a substrate to a greater depth, and thus to provide some degree of information on features underneath the substrate surface, these lighter ions are much less useful for milling applications. This is precisely because the lighter ions tend to penetrate the sample surface rather than impacting and sputtering away material like heavier ions such as gallium.

Of course, the principal limitation for sub-surface imaging is not necessarily the mean ion penetration depth, but rather the depth from which secondary electrons can escape from the sample and be detected. Nevertheless, metal layers on modern IC devices are extremely thin (80-120 nm). Gallium ions have a mean penetration depth of ~27 nm in silicon, and therefore will not penetrate deeper than one IC layer. However, ions with masses below ~20 amu will do so at 50 keV, and ions below ~12 amu will do so at 30 keV. In this regard, He+, Li+, Be+, B+, O+, Ne+, and possibly Si+ should be capable of penetrating typical IC layer thicknesses.

As used herein, the terms "light ions" or "relatively low mass ions" will be used to refer to ions that will penetrate at least one IC layer. "Heavy ions" or "relatively high mass ions" will refer to ions with greater masses than silicon (~28 amu), which are more suitable for rapid material removal. As used herein, "rapid material removal" will refer to material removal rates for a given sample type and beam configuration that are at least as fast as the material removal rate for the sample type and beam configuration using silicon ions. Persons of skill in the art will recognize that the greater the amu difference between the two ions species, the more subsurface information that will be provided by the light ions species relative to the information provided by the heavy ion imaging. Preferably the heavier elemental species will have a mass that is at least double the mass of the lighter elemental species. In some preferred embodiments, the heavier ions will have a mass that is at least 40 amu greater than the lighter ions; more preferably, the heavier ions will have a mass that is at least 100 amu greater than the lighter ions.

Further, it should be noted that the term "secondary electron" is typically used to refer to a free electron emitted from a sample surface that is produced by the interaction of a primary incident particle having sufficient energy with valence electrons in the sample. Such emitted electrons with energies less than 50 eV are called secondary electrons. Because of their low energies, secondary electrons generated more that a certain distance below the sample surface cannot escape from the specimen. Although the maximum escape depth varies by compound, most secondary electrons are produced within 2-5 nm of the surface. Because light ions can be used to generate subsurface images at a depth far greater than 5 nm, it does appear that there are other mechanisms at work for ions penetrating deeply to change the number of electrons escaping from the surface.

Figure 4A:
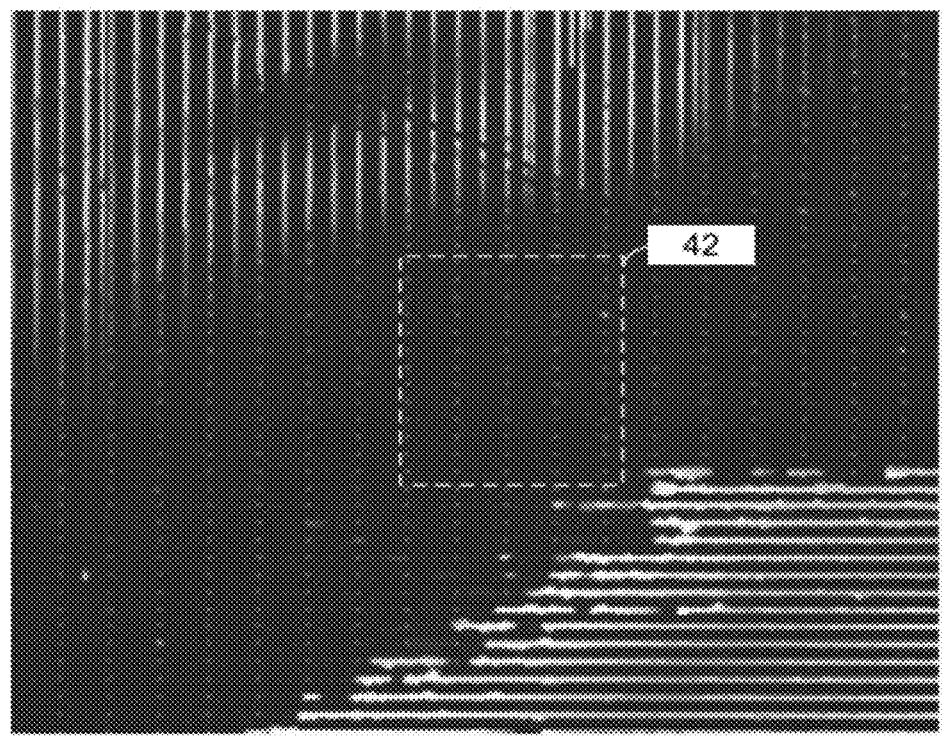
FIGS. 4A and 4B show photomicrograph images of a backside IC device after a wedge polish that has been imaged using relatively high mass gallium ions.
Figure 4B:
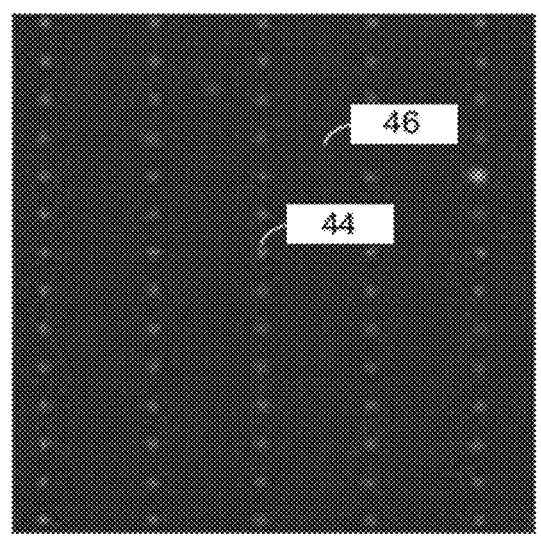

But in any case, features beneath the sample surface can be imaged by detecting electrons escaping the substrate surface as a beam of relatively light ions is scanned across the surface, whether the escaping electrons are true secondary electrons, backscattered ions, or result from charging effects, for example. This type of subsurface imaging can be clearly seen by comparing FIGS. 4A and 4B with FIGS. 5A and 5B. FIG. 4A shows a photomicrograph image of a backside IC device after a wedge polish that has been imaged using relatively high mass gallium ions. FIG. 4B is an enlargement of the area indicated by reference number 42 in FIG. 4A. This image of the IC device shows only vias (which appear as the white dots 44 surrounded by the dark dielectric material 46).

Figure 5A:
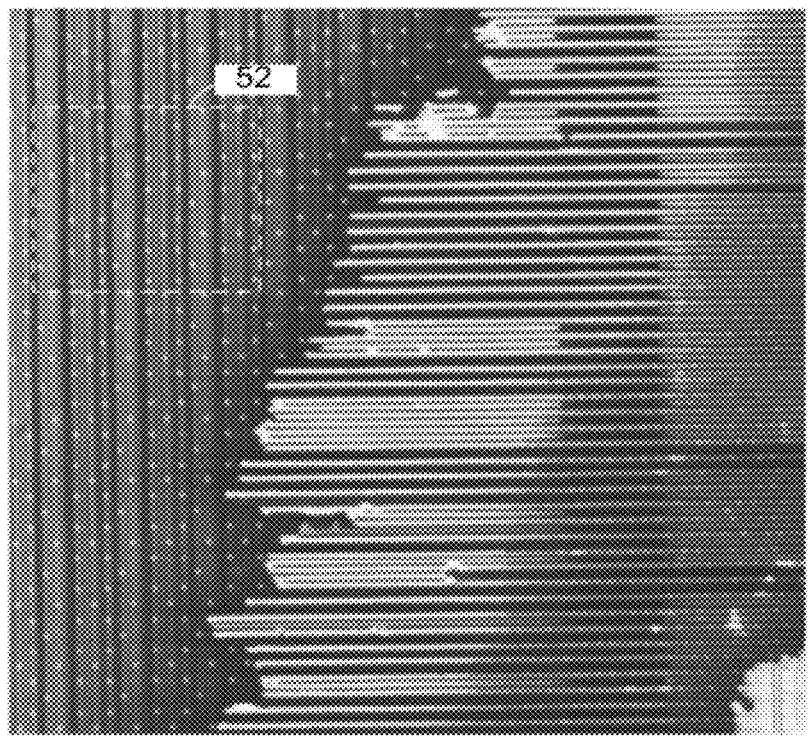
FIGS. 5A and 5B show photomicrograph images of a backside IC device after a wedge polish that has been imaged using relatively low mass beryllium ions.
Figure 5B:
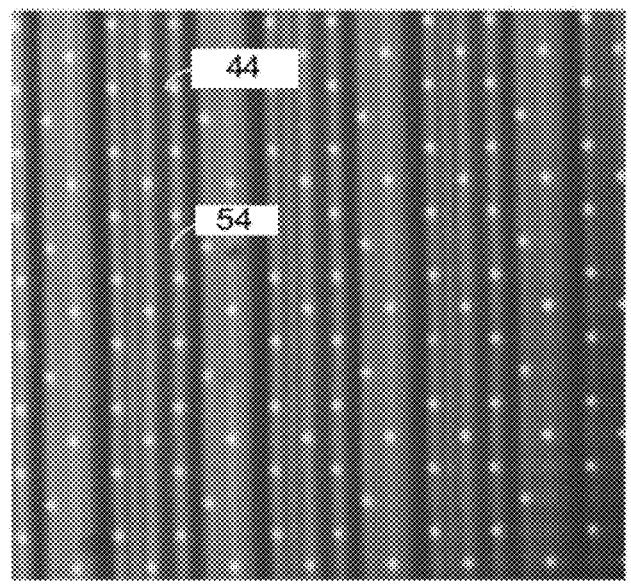

FIGS. 5A and 5B (where FIG. 5B is an enlargement of the area indicated by reference number 52 shown in FIG. 5A) show similar photomicrograph images of a backside IC device after a wedge polish that has been imaged using relatively low mass beryllium ions. When compared to FIGS. 4A and 4B, it is clear that a number of sub-surface features, such as metal lines 54, can be clearly seen in FIGS. 5A and 5B. These metal lines are buried underneath the sample surface and are not visible at all in the surface images of FIGS. 4A and 4B.

Figure 6A:
FIG. 6A shows a photomicrograph image of an area of an IC device containing N-well contrast (doped silicon) regions that was imaged using gold ions.
Figure 6B:
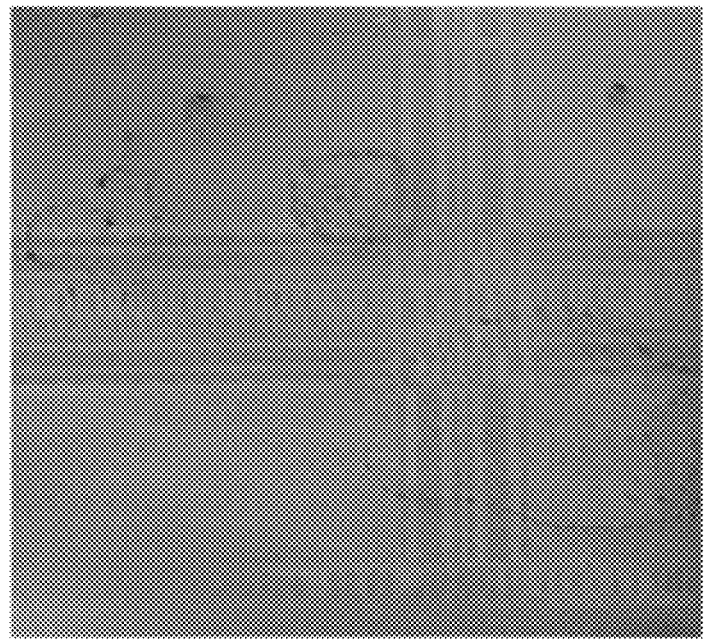
FIG. 6B shows a photomicrograph image of an area of an IC device containing N-well contrast (doped silicon) regions that was imaged using beryllium ions.

FIGS. 6A to 6B also illustrate the differences in images produced by heavy and light ions for an area of an IC device containing N-well contrast (doped silicon) regions. FIG. 6A was imaged using relatively heavy gold (Au+) ions and almost no sample features can be seen. FIG. 6B, however, was imaged using much lighter beryllium (Be2+) ions. In this photomicrograph, features beneath the surface can be clearly seen.

Any ion with a mass lighter than silicon should provide superior sub-surface imaging, and any ion lighter than gallium will be superior to what we can achieve today with conventional gallium-based liquid metal ion sources (LMIS). According to preferred embodiments, lighter mass ions will be able to penetrate the sample surface to a depth of >80 nm, more preferably to a depth of >120 nm. As a result, the preferred lighter ions will also provide subsurface image information to a depth of >80 nm, more preferably to a depth of >120 nm. Lighter ions will also cause less sample damage, as compared to that caused by heavier ions such as gallium. Of course, this means that lighter ions will be much less efficient at removing material via sputtering, which makes ion beams formed from light ions unsuitable for most circuit edit (CE) applications.

Applicants have discovered, however, that because the electrostatic optics used to focus an ion beam are insensitive to ion mass, it is possible to focus an ion beam containing a mixture of different size ions coaxially to the same focal point. In other words, using a combined beam consisting of a heavy species, such as gallium, and a light species, such as beryllium, the focused beam position for both the heavy species and the light species will be coincident. Using such a mixed beam, it is thus possible to efficiently mill away material with the heavy ion component, while using the lighter ions to obtain additional imaging information. Because the light ions penetrate deeper into the sample, subsurface features can actually be imaged directly while the milling is taking place.

Preferred embodiments of the present invention provide significant advantages in certain types of substrate processing, for example in CE applications described above. Navigation to the precise location of a buried target structure is much easier and faster using the present invention because sub-surface structures do not have to be exposed in order to use their coordinates to locate a particular feature. Instead, using the sub-surface information provided by the light ions, such features can be located and correlated to the CAD design data. A convenient way of doing this is to "overlay" the CAD shapes onto the secondary FIB image and then to perform a two or three point CAD polygon registration. Once the coordinates from the IC chip design have been mapped to the actual sample, and the FIB system has navigated to the approximate area of the target structure, any additional sample registration is also easier and faster because local features underneath the sample surface can also be observed and used to re-register the sample and image. The present invention also makes it much easier to expose the buried target structure once it has been located. Because features can been seen in the secondary FIB image before such features are exposed to the heavy ions in the mixed beam, it becomes much easier to stop milling before the target structure is damaged or destroyed.

Thus, in preferred embodiments of the present invention, an alloy source capable of producing two different ions, one relatively light (low mass) and one relatively heavy (high mass), can be used to produce a mixed ion beam for imaging and processing the sample. Preferably, the two different ions are not separated by using a mass filter, but rather are both present in the beam that is focused onto the sample. In some embodiments, a mass filter may still be used to filter out other types of ions, for example when the alloy source is a tertiary alloy source but it is only desirable to use two of the ion species for imaging and processing the sample. In other embodiments, as described below, a mass filter can be used to rapidly switch between ions in order to "tune" the ratio of light and heavy ions striking the sample surface.

Alloy sources are known in the prior art, and any such source could be used to practice the present invention as long as the source produces a suitable combination of light and heavy ions. For example, AuSiBe, AuSi, and AsPdB alloy sources are commercially available. As discussed in greater detail below, it will sometimes be desirable to adjust the ratio of light to heavy ions for a particular application. With an LMIS, the ratio is fixed by the ratio of elements in the alloy. Most commercially available alloy sources are eutectic compositions, which means that the percentages of the elements result in the lowest melting point for the combination. In addition to a lower melting point the bulk composition remains more stable at the eutectic composition. Although different compositions are typically possible, the resulting melting point and vapor pressure of the resulting alloy must be suitable for use as an alloy LMIS. A number of other factors also contribute to the suitability of a particular alloy for use as an alloy LMIS. These factors include: whether the melting point is sufficiently low, the vapor pressure at the melting point, whether the alloy reacts with typical (or easy to use) substrate materials while at operating temperature, whether the alloy wets the substrate material, whether the alloy is easy to handle in air (for example, alloys containing Li and Cs are good example of compositions that are not), and whether the bulk composition remains constant over time/operation.

Figure 7A:
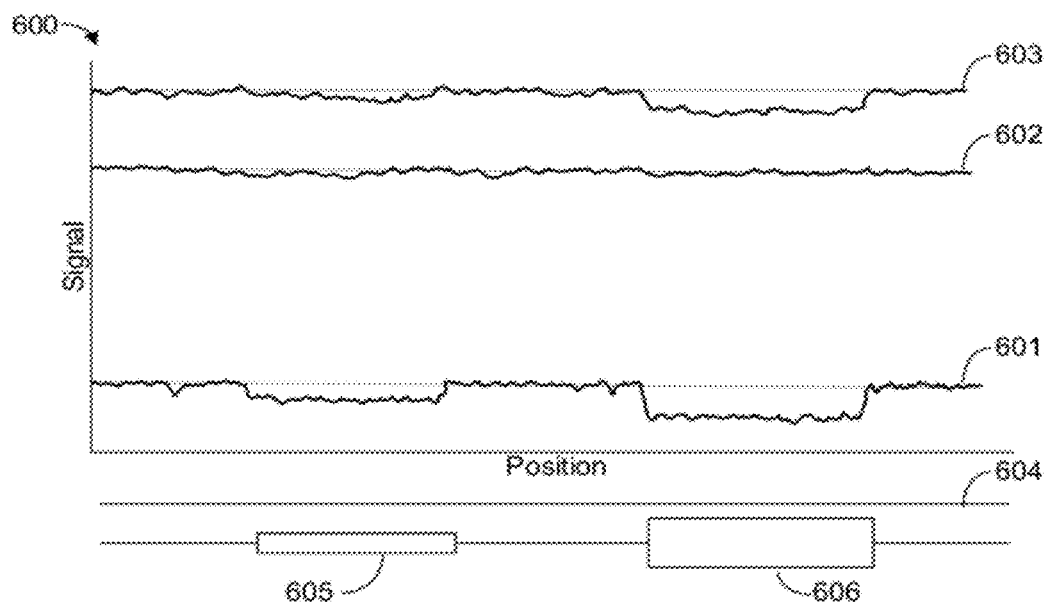
FIGS. 7A and 7B illustrate theoretical CRT line scans showing signal versus position for two possible mixed ion beams.
Figure 7B:
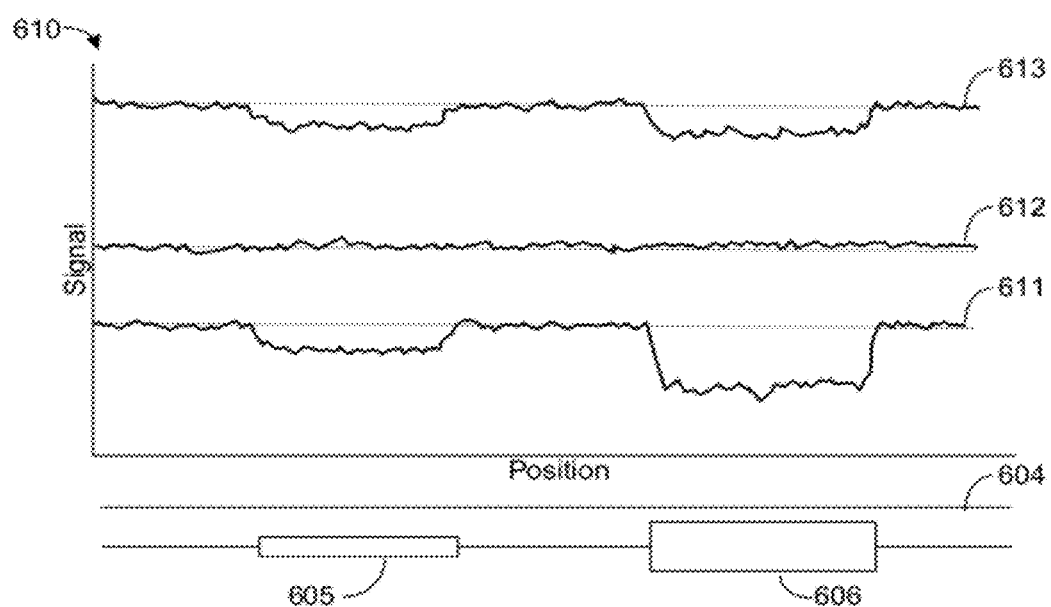

A suitable alloy LMIS for practicing the present invention must also have a high enough content of a light ion to enable adequate subsurface imaging of the desired features and a high enough content of the heavy ion to allow material removal to proceed at a high enough rate. FIGS. 7A and 7B illustrate theoretical CRT line scans showing signal versus position for two possible mixed ion beams. Although in actual mixed beam operation it is difficult if not impossible to separate out the secondary electron produced by the light ions from those produced by the heavy ions, in these two signal graphs, lines 601 and 611 illustrate the electron signal that might be produced by the light ion species, while lines 602 and 612 illustrate the electron signal that might be produced by the heavy ion species. Lines 603 and 613 show the combined signal (respectively signal values shown by lines 601 plus 602 and lines 611 plus 612), which would be representative of the signal that would be detected during actual operation.

In FIG. 7A, the mixed beam has a relatively low percentage of light ions as compared to heavy ions. As the mixed ion beam is scanned across the sample surface 604, the heavy ions do not penetrate the featureless surface of the sample and so the changes in signal reflect only system background noise. The lighter ions do penetrate the sample surface and thus return information about buried features 605 and 606. As shown in FIG. 7A, however, sample 605 is a relatively low contrast feature (harder to distinguish from the surrounding substrate because of size, composition, depth, etc.). While the signal line 601 does show the presence of buried feature 605, the signal difference is small enough that it gets lost in the much larger signal resulting from the heavy ion species. As a result, in the combined signal line 603, it would be very difficult to distinguish the contrast resulting from feature 605 from the signal noise. On the other hand, feature 606 is a higher contrast feature, so even using a relatively low percentage of light ions, the signal contrast is great enough that it can be seen in the combined signal 603.

In FIG. 7B, the mixed beam has a higher percentage of light ions as compared to heavy ions. As a result, even for low contrast feature 605, the signal contrast is great enough that it can be separated from the background noise in the combined signal. Of course, the signal contrast for feature 606 would be even greater. Significantly, the increased signal contrast for subsurface features resulting from a greater percentage of light ions comes at the price of decreased milling speed. For most applications, it would be desirable to tune the relative percentages of the light/heavy ions to achieve the minimum acceptable subsurface imaging sensitivity (in other words, to achieve the minimum acceptable percentage of light ions) in order to maximize milling speeds. For example, high contrast subsurface images could be identified in the combined signal even if the percentage of light ions was relatively low. If the percentage of light ions gets too low, however, the signal contrast from even high contrast features would be lost in the much greater electron signal resulting from the surface impact of the heavy ion species. For very low contrast subsurface features, it might require a very high percentage of light ions, in some cases approaching 100%.

In most cases, sufficient "tuning" of the percentages of light and heavy ions can be accomplished by through the selection of a particular standard alloy LMIS source. Persons of skill in the art will be able to balance the considerations for a particular application to select a suitable known alloy LMIS for most applications without undue experimentation.

In other cases, however, it may be desirable to more finely tune the relative percentages or to adjust the percentages "on-the-fly" as a sample is being processed. U.S. patent application Ser. No. 12/373,676 by Smith, et al., for "Multi-Source Plasma Focused Ion Beam System," which is assigned to the Assignee of the present invention and is hereby incorporated by reference, describes a plasma FIB that is capable of switching between multiple gas sources. A similar apparatus, as described in greater detail below, could be used to deliver multiple gases at the same time, resulting in a mixed beam containing multiple ion species.

Figure 8:
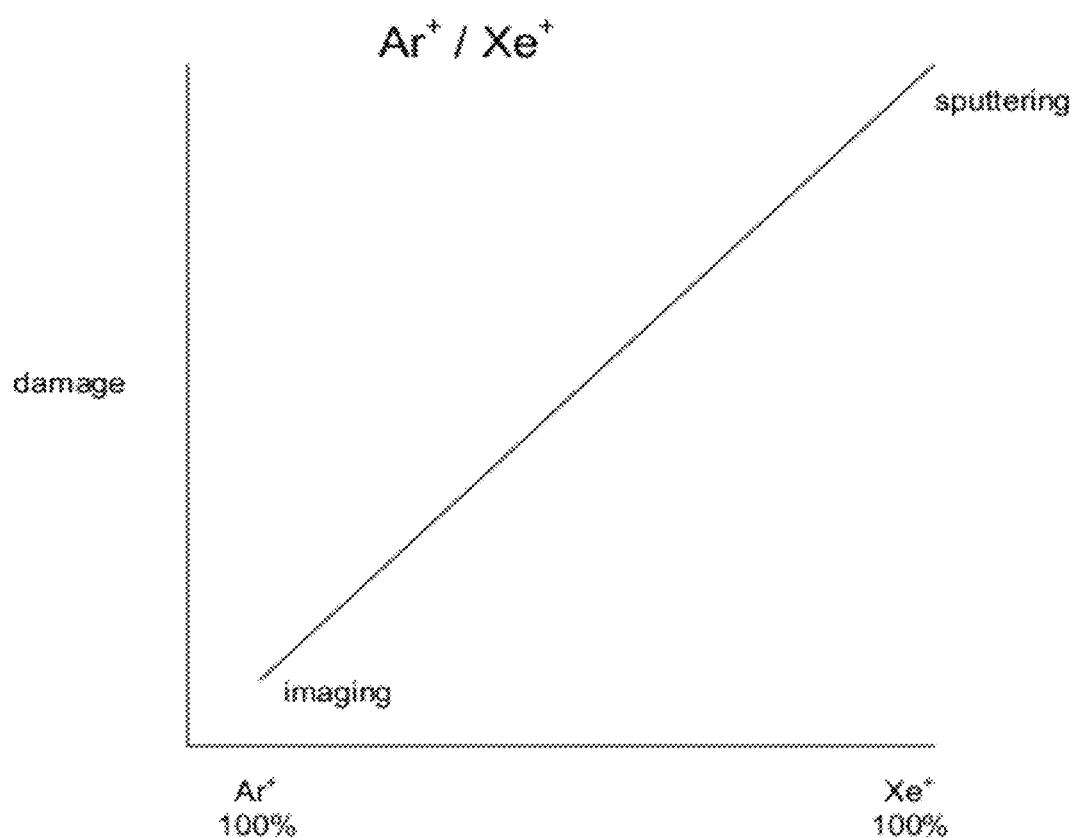
FIG. 8 is a graph showing the relationship between a mixed beam suitable for pure imaging to a mixed beam suitable for pure sputtering and the plasma gas ratio for an argon/xenon mixture.

Using such a multi-source plasma FIB, the relative percentages of the light and heavy ions could be easily adjusted to any desired percentage, for example between pure imaging (100% light ions) and pure sputtering (100% heavy ions) as shown in FIG. 8 for a mixture of gold and xenon ions. The use of such a multi-source plasma FIB would also allow the percentages to be adjusted "on-the-fly" so that, for example, a greater concentration of light ions could be used for imaging subsurface images for navigation purposes, but the percentage of heavy ions could be increased for faster milling once the buried feature of interest is located. Because the mix of ion species would be controlled via the gas sources, preferred embodiments of the present invention could be practiced using a plasma FIB without a mass filter.

In the case of an alloy LMIS, the composition of the source itself cannot be adjusted, although it would be possible to produce customized sources that would produce desired percentages of light and heavy ions. Significantly, when using an alloy LMIS containing an appropriate percentage of light and heavy ions, a mass filter would also not be necessary, which would greatly decrease system cost and complexity.

Although the composition of the alloy source cannot be adjusted "on-the-fly" like the gas composition in a multi-source plasma FIB, the use of an alloy LMIS system that is equipped with a mass filter would allow for some adjustment of the relative percentages of light and heavy ions impacting the surface. According to preferred embodiments of the present invention, a mass filter could be used to rapidly switch between ion species at a selected frequency during material processing. For example, the mass filter could allow only light ions to strike the sample for a short period, then switch to heavy ions for another set very short period. By rapidly alternating between light ions and heavy ions at a set frequency, the sample imaging can be made to appear to an operator simultaneous with the sample milling. Although the use of light and heavy ions would be alternating rather than simultaneous, it would appear to an operator as though a true mixed and coincidental beam were being used.

The rate at which a given system can switch between light and heavy ions to produce such a "pseudo" mixed beam will depend upon the how frequently the magnetic mass filter can be adjusted. A typical mass filter can be adjusted between ion species by applying a periodic function to the mass filter voltage with a frequency in the MHz range, although the time required for the magnet to settle would preferably be built into the data acquisition so that data (imaging) is only collected at appropriate times. A duty cycle switching between ion species of approximately a tenth of a second would be fast enough that it would not visually disturb an operator viewing the sample processing in real time. By adjusting the length of time that each ion species is allowed through the mass filter, the beam could be adjusted to favor non-destructive imaging or aggressive sputtering, depending on the application.

Figure 9:
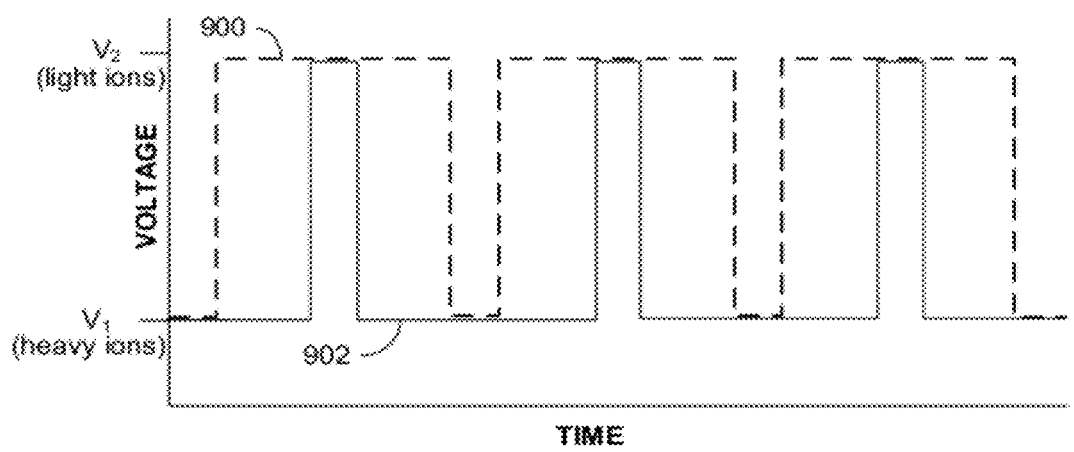
FIG. 9 shows a graph of mass filter electromagnet voltage versus time for two different possible duty cycles for switching between light and heavy ions in a pseudo mixed beam.

This is illustrated in FIG. 9, which shows a graph of mass filter electromagnet current versus time for two different possible duty cycles for switching between light and heavy ions in a pseudo mixed beam. Dashed line 900 and solid line 902 each show the voltage applied to the mass filter magnet over time, with a periodic function applied that switches the magnet between $V_1$, where only the heavy ion species is allowed through the mass filter, and $V_2$, where only the light ion species is allowed through. As shown in the graph, for the duty cycle shown by dashed line 900, the mass filter stays at voltage M2 (allowing light ions through) approximately five times longer than in the cycle shown by solid line 902. As a result, sample processing using the cycle shown by line 900 would result in a relatively higher percentage of light ions striking the sample per cycle than would the cycle shown by line 902. This would make the cycle of line 900 more suitable for less destructive imaging, while the cycle of line 902 would result in a greater number of large ions and thus more rapid material removal. The frequency for both duty cycle times in FIG. 9 is approximately 10 Hz, although different frequencies could be used.

Figure 10:
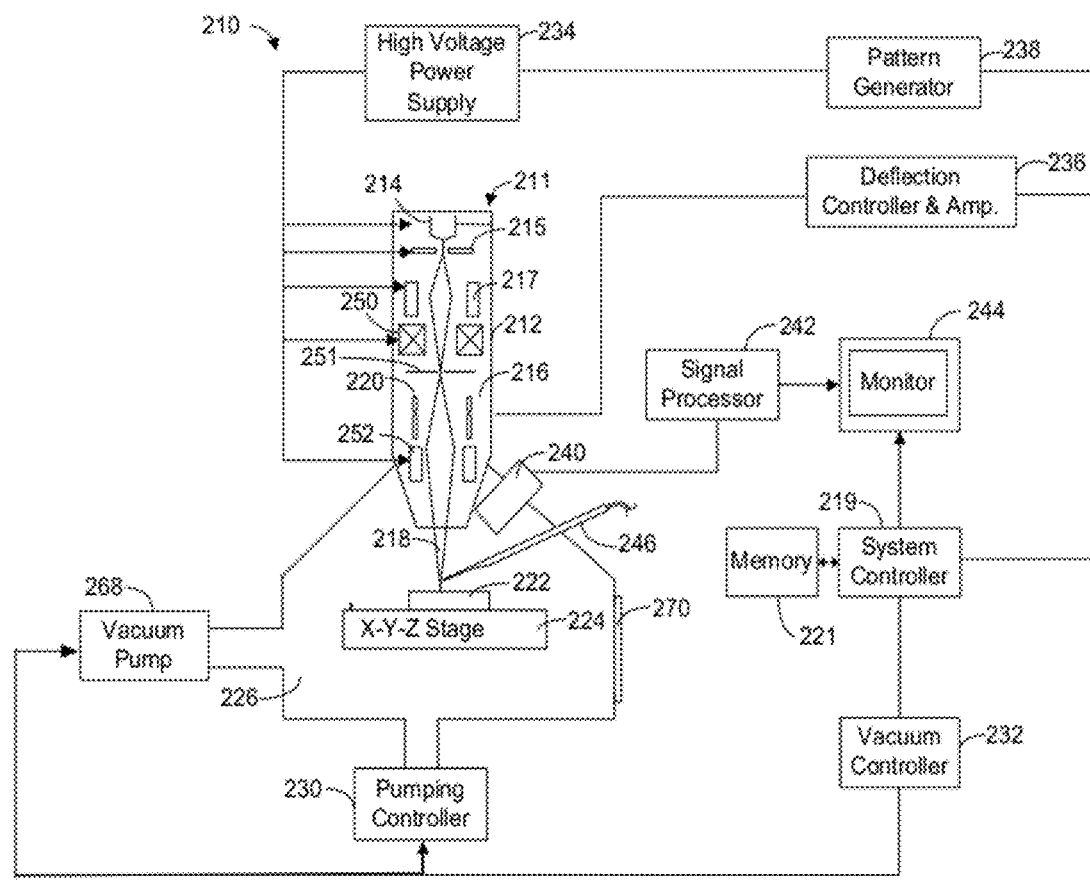
FIG. 10 shows a LMIS FIB system with a mass filter that could be used to implement aspects of the present invention.

FIG. 10 shows a typical FIB system 210 that could be used to implement preferred embodiments of the present invention. The present invention could also be implemented using other particle beam systems, including for example, dual-beam systems, such as FIB/SEM dual beam system.

Focused ion beam system 210 includes an evacuated envelope 211 having an upper neck portion 212 within which are located an ion source 214 and a focusing column 216 including extractor electrodes 215 and an electrostatic optical system including condenser lens 217 and objective lens 252. Ion source 214 is preferably an alloy LMIS which produces ions of more than one elemental species, preferably a combination of light and heavy ions. As used herein, the phrase "different elemental species" (or "more than one elemental species") is used to refer to ions having a different elemental composition. Typically ions will be of at least two different elements entirely, such as the mixed beam of gold and beryllium ions described above. In some embodiments, however, one or both of the mixed ions could be an ion composed of more than one element (AuBe+, for example). Once the ions, both light and heavy, are extracted from the source, they are accelerated and focused onto the sample by way of electrostatic lenses within focusing column 216. In other preferred embodiments, a plasma source could be used, preferably one including multiple gas sources.

Ion beam 218 passes from ion source 214 through column 216 and between electrostatic deflection means schematically indicated at 220 toward sample 222, which comprises, for example, a semiconductor device positioned on movable X-Y-Z stage 224 within lower chamber 226. An ion pump or other pumping system (not shown) can be employed to evacuate neck portion 212. The chamber 226 is evacuated with turbomolecular and mechanical pumping system 230 under the control of vacuum controller 232. The vacuum system provides within chamber 226 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

High voltage power supply 234 is connected to ion source 214 as well as to appropriate electrodes in focusing column 216 for forming an ion beam 218 and directing the same downwardly. Deflection controller and amplifier 236, operated in accordance with a prescribed pattern provided by pattern generator 238, is coupled to deflection plates 220 whereby beam 218 may be controlled to trace out a corresponding pattern on the upper surface of sample 222. In some systems the deflection plates are placed before the final lens, as is well known in the art.

The ion source 214 typically provides a metal ion beam of gallium, although other ion sources, such as a multicusp or other plasma ion source, can be used. The ion source 214 typically is capable of being focused into a sub one-tenth micron wide beam at sample 222 for either modifying the sample 222 by ion milling, enhanced etch, material deposition, or for the purpose of imaging the sample 222. When the ions in the ion beam 218 strike the surface of work piece 222, secondary electrons and backscattered electrons are emitted. A charged particle multiplier 240 used for detecting secondary ion or electron emission for imaging is connected to signal processor 242, where the signal from charged particle multiplier 240 are amplified, converted into digital signals, and subjected to signal processing. The resulting digital signal is to display an image of sample 222 on the monitor 244.

A door 270 is opened for inserting sample 222 onto stage 224, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 216 for energizing and focusing ion beam 218.

A gas delivery system 246 extends into lower chamber 226 for introducing and directing a gaseous vapor toward sample 222. U.S. Pat. No. 5,851,413 to Casella et al. for "Gas Delivery Systems for Particle Beam Processing," assigned to the assignee of the present invention, describes a suitable gas delivery system 246. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

System controller 219 controls the operations of the various parts of dual beam system 20. Through system controller 219, a user can cause ion beam 218 to be scanned in a desired manner through commands entered into a conventional user interface (not shown). System controller 219 can also comprise computer-readable memory 221 and may control dual beam system 210 in accordance with data or programmed instructions stored in memory 221. CAD data concerning the sample/semiconductor stored in memory 221 can be used to create a CAD polygon overlay or other positional data used to locate a feature of interest and alignment points or transfer fiducials as described above.

Optionally, FIB system 210 can also include a mass separator such as mass filter 250 to separate out a single ion species from the combination of heavy and light species provided by an alloy LMIS or plasma source. When a magnetic field is applied by mass filter 250, the mixed ion beam will be spread out by mass. A proper selection of voltage will allow only one ion species to pass through the mass selection aperture 251 and on through the lower column to the sample. A different voltage will allow the other ion species to pass through the aperture. Preferably, mass filter 250 will be capable of rapidly switching between selected voltages to alternate light and heavy ion beams with a frequency in the MHz range.

Figure 11:
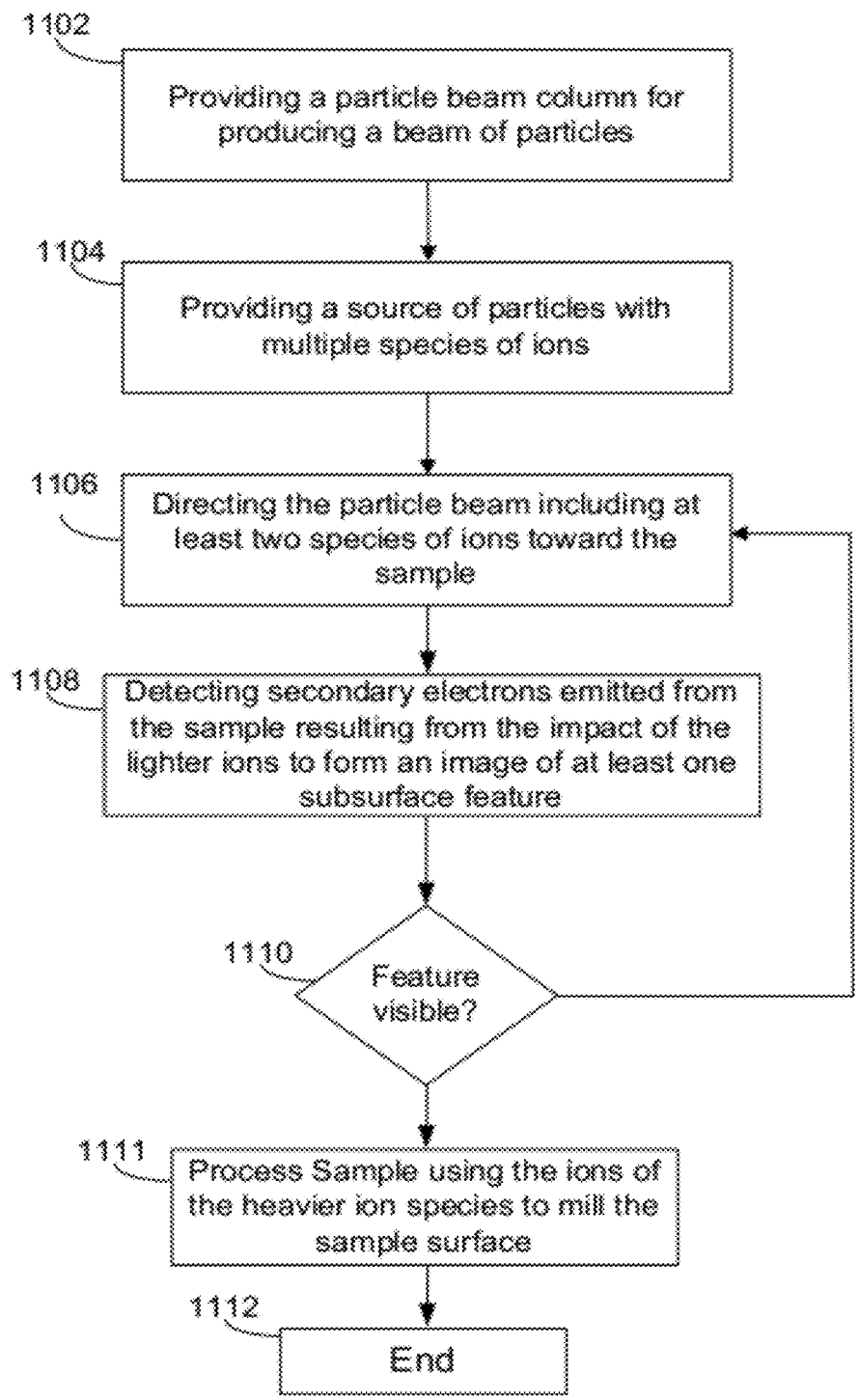
FIG. 11 shows the steps of an embodiment of the invention in which etching and imaging are simultaneously performed.

FIG. 11 shows the steps of an embodiment of the invention in which etching and imaging are simultaneously performed. Step 1102 includes providing an ion source that produces at least two species of ions. Step 1104 includes providing an ion beam column for producing a beam of ions, the beam including the at least two species of ions, each having different a elemental composition, with one ion species being having a lower mass and one ion species having a higher mass. Step 1106 includes directing the particle beam including at least two species of ions toward the sample to process and image the sample simultaneously. Step 1108 then includes detecting the secondary electrons emitted from the sample resulting from the impact of the lighter ions to form an image of at least one subsurface feature. In step 110, if the adequate features have been exposed, using the location of the imaged subsurface features to direct the ion beam toward the sample. In step 1111 the sample is processed using the ions of the heavier ion species to mill the sample surface. The method ends with step 1112 as the processing and imaging is complete. In some embodiments, the percentage of particles in the beam can be altered to fine-tune the imaging and processing capabilities of the focused ion beam. A higher concentration of heavy ions will allow material to be removed at a high rate, while a higher concentration of light ions will allow adequate subsurface imaging.

Although the description of the present invention above is mainly directed at methods of generating and using an ion beam composed of a mixture of light and heavy ions, it should be recognized that an apparatus performing the operation of such a method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation.

Further, throughout the present specification, discussions utilizing terms such as "calculating," "determining," "measuring," "generating," "detecting," "forming," "superimposing," "imaging," "navigating" or the like, also refer to the action and processes of a computer system, or similar electronic device, that manipulates and transforms data represented as physical quantities within the computer system into other data similarly represented as physical quantities within the computer system or other information storage, transmission or display devices or that controls the operation of a particle beam system.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

Although much of the previous description is directed at semiconductor wafers, the invention could be applied to any suitable substrate or surface. Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An apparatus for high accuracy beam placement and navigation to a feature of interest on a sample, comprising:
   a source of ions, the source producing ions of more than one elemental species; and
   a particle beam column for producing a coaxial mixed beam of ions including ions of more than one elemental species and for focusing the mixed beam to a focal point at or near the sample.

2. The apparatus of claim 1 in which the source of ions produces a mixture of ions of a lighter elemental species having a mass of <20 amu and a heavier elemental species having a mass of >28 amu.

3. The apparatus of claim 2 in which the source of ions is a plasma source, said plasma source including multiple gas sources for delivering multiple gases at the same time to produce ions of more than one elemental specie and in which the amounts of the multiple gases delivered to the plasma source can be adjusted to change the ratio of ions produced between the more than one elemental species.

4. The apparatus of claim 2 in which, in operation, the ions of the lighter elemental species can be used to produce a subsurface image of the sample to a depth of >80 nm.

5. The apparatus of claim 4 in which, in operation, the ions of the heavier elemental species can be used to rapidly remove sample material.

6. The apparatus of claim 5 in which, in operation, the subsurface image is used to control the material removal.

7. The apparatus of claim 5 in which, in operation, the ratio of light to heavier elemental species in the mixed beam can be altered to fine-tune the imaging and/or etching of the sample.

8. The apparatus of claim 5 further comprising a computer-readable memory storing computer instructions, the instructions including a program for controlling the apparatus to carry out the steps of:
   detecting secondary electrons resulting from the impact of ions of the lighter ion species on the sample to form an image of a subsurface feature of the sample;
   using the location of the imaged subsurface feature to direct the ion beam toward the sample; and
   processing the sample using the ions of the heavier ion species to mill the sample surface.

9. The apparatus of claim 1 in which the source of ions produces a mixture of ions of a lighter elemental species and ions of a heavier elemental species, with the heavier elemental species having an atomic mass that is at least double the atomic mass of the lighter elemental species.

10. The apparatus of claim 1 in which the source of ions produces a mixture of ions comprising ions of a lighter elemental species and ions of a heavier elemental species, with the heavier elemental species having an atomic mass that is at least 40 amu greater than the atomic mass of the lighter elemental species.

11. The apparatus of claim 1 in which the source of ions produces a mixture of ions comprising ions of a lighter elemental species and ions of a heavier elemental species, the lighter elemental species having an atomic mass that is low enough that the ions of the lighter elemental species will penetrate the sample surface to a depth of >120 nm when the mixed beam is focused onto the surface and the heavier elemental species having an atomic mass that is high enough that the ions of the heavier elemental species will rapidly remove sample material by sputtering when the mixed beam is focused onto the surface.

12. The apparatus of claim 1 in which the more than one elemental species of ions in the mixed beam process and image the sample simultaneously.

13. The apparatus of claim 1 in which the source of ions is an alloy liquid metal ion source.

14. The apparatus of claim 13 in which the alloy is AuSiBe, AuSi, or AsPdB.

15. The apparatus of claim 13 in which the alloy liquid metal ion source produces one elemental species of ion having a lower mass and another ion species having a higher mass.

16. The apparatus of claim 15 in which the type of alloy liquid metal ion source used is determined by the ratio of lighter to heavier ion species produced by a given alloy liquid metal ion source.

17. The apparatus of claim 15 further comprising a mass filter for filtering between the lower and higher mass ions so that the beam comprises only ions of one of either the lighter or heavier ions, and a computer-readable memory storing computer instructions, the instructions including a program for controlling the apparatus for causing rapid switching back and forth between the at least first and second species of ions at a selected frequency.

18. The apparatus of claim 17 in which lighter ions are for subsurface imaging of the sample and in which the heavier ions are for processing the sample.

19. The apparatus of claim 18 in which the length of time that each of the lighter or heavier ions is filtered by the mass filter is adjusted to favor subsurface imaging rather than sample processing or to favor sample processing rather than subsurface imaging.

20. The apparatus of claim 18 further comprising a computer-readable memory storing computer instructions, the instructions including a program for controlling the apparatus to carry out the steps of:

detecting secondary electrons resulting from the impact of ions of the lighter ion species on the sample to form an image of a subsurface feature of the sample; and using the location of the imaged subsurface feature to direct the ion beam toward the sample; and processing the sample using the ions of the heavier ion species to mill the sample surface.

21. The apparatus of claim 13 in which the source of ions is an alloy liquid metal ion source producing more than two different elemental species of ions and further comprising a mass filter used to filter out at least one elemental species of ions but allow a mixed beam of two different elemental species of ions to be focused onto the sample.

* * * * *